(12) United States Patent
Acosta et al.

(10) Patent No.: US 6,459,338 B1
(45) Date of Patent: Oct. 1, 2002

(54) SINGLE LOOP OUTPUT COMMON MODE FEEDBACK CIRCUIT FOR HIGH PERFORMANCE CLASS AB DIFFERENTIAL AMPLIFIER

(75) Inventors: Julio E. Acosta, Richardson; Kambiz Hayat-Dawoodi, Plano, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/863,692

(22) Filed: May 23, 2001

(51) Int. Cl.[7] ................................................ H03F 3/45
(52) U.S. Cl. ...................... 330/257; 330/258; 330/259
(58) Field of Search ................................ 330/257, 258, 330/259

(56) References Cited

U.S. PATENT DOCUMENTS 6,281,751 B1 * 8/2001 Mevlik ........................ 330/255

* cited by examiner

Primary Examiner—Michael B Shingleton
(74) Attorney, Agent, or Firm—W. Daniel Swayze, Jr.; W. James Brady; Frederick J. Telecky, Jr.

(57) ABSTRACT

A class AB input differential amplifier employs a single loop output common mode feedback circuit (CMFC) to achieve high performance by controlling the common mode output voltage. The CMFC includes a small amplifier to compare the common mode voltage at the output with a desired voltage specified at the common mode output voltage pin. Having only one loop to control this voltage instead of two makes the design more reliable and easier to compensate since there is no need to worry about how multiple loops will interact.

4 Claims, 4 Drawing Sheets

SINGLE LOOP OUTPUT COMMON MODE FEEDBACK CIRCUIT FOR HIGH PERFORMANCE CLASS AB DIFFERENTIAL AMPLIFIER

BACKGROUND OF THE INVENTION

1. Field of the Invention

This invention relates generally to differential amplifiers, and more particularly to an amplifier with a class AB differential input stage that employs a single loop output common mode feedback circuit to achieve high performance as compared to amplifiers with class AB differential input stages that employ two loop solutions which have loop interplay.

2. Description of the Prior Art

Differential amplifiers are very useful devices when dealing with differential systems. They have several advantages such as very good common mode rejection ratio since everything that is common will get canceled at the differential output. Some applications of differential amplifiers include single ended to differential conversion, differential ADC driver, differential transmitter and receiver, and output level shifter.

Differential amplifiers are not too different from single ended amplifiers. Several single ended topologies can be converted to differential topologies. The most obvious difference between differential amplifiers and their single ended counterparts is that they have two outputs instead of one. With the addition of this output, another difference arises, which is the "output common mode feedback circuit" (CMFC). Extra circuitry is necessary to direct the outputs where to go DC wise. Since this signal is common to both outputs differentially, it will cancel, leaving at the differential output only the amplified differential input signal.

Implementing such a common mode circuit is challenging. FIG. 1 illustrates one implementation of a differential amplifier 100 that includes an emitter coupled pair input stage 102 with a folded cascode gain stage 104. The CMFC includes an error amplifier 106 that compares the common mode voltage at the outputs to the voltage set on the $V_{ocm}$ pin 108 (seen defaulted to mid rail in FIG. 1). The error amplifier 106 adjusts the common mode voltage by changing the voltage in the bases of transistors Q5 and Q6. The feedback path of the error amplifier 106 in FIG. 1 is from the output of the error amplifier 106 to the bases of transistors Q5 and Q6, to the outputs of the main amplifier through the buffers 110, 112, and back into the positive input of the error amplifier 106.

The class AB input stage in a differential configuration has several advantages over the class A single emitter coupled pair input stage illustrated in FIG. 1. Some of these advantages include better slew rate and better THD performance, especially at high frequencies. It would be desirable to have a way of implementing the foregoing CMFC on this topology. FIG. 2 is a schematic diagram illustrating a differential class AB amplifier 200 without the CMFC. It can be seen this topology is quite different from the one shown in FIG. 1. One of the primary differences between this kind of circuit and the circuit in FIG. 2 is that in FIG. 1 it is only necessary to manipulate the current of transistors Q5 and Q6 to control the output common mode voltage. In the circuit of FIG. 2, it is necessary to manipulate the top mirrors Q5, Q6 and Q13, Q14 as well as the bottom mirrors Q7, Q8 and Q15, Q16. The conventional prior art solution includes the use of two loops to control the two sets of mirrors, and that way control the output common mode voltage. This conventional approach has been problematic however since it results in undesirable distortion associated with additional parasitics and mismatch between the loops, stability problems due to complexity of the multiple control loops and the interaction between them, added complexity, and circuitry that consumes additional die area.

In view of the foregoing, it would be desirable to have a way of implementing the CMFC on a class AB input stage in a differential configuration in a manner that does not result in additional distortion, or stability problems due to increased complexity of multiple control loops, and that does not undesirably increase the required die area.

SUMMARY OF THE INVENTION

The present invention is directed to an amplifier with a class AB differential input stage that employs a single loop output common mode feedback circuit (CMFC) to achieve high performance by controlling the common mode output voltage. The CMFC includes a small amplifier to compare the voltage at the outputs with a desired voltage. Having only one loop to control this voltage instead of two makes the design more reliable and easier to compensate since there is no need to worry about how multiple loops will interact. The distortion caused by the nonlinear parasitics associated with the CMFC are minimized by connecting the CMFC to a point at the input where the voltage does not change as much as in the output of the input stage, where the full voltage signal is seen.

According to one aspect of the invention, an amplifier with a class AB input stage in a differential configuration is implemented with common mode feedback circuitry having only one loop to control the output common mode voltage;

According to another aspect of the invention, an amplifier with a class AB input stage in a differential configuration is implemented with common mode feedback circuitry (CMFC) having only one loop to control the output common mode voltage such that distortion caused by the CMFC is minimized;

According to yet another aspect of the invention, an amplifier with a class AB input stage in a differential configuration is implemented with common mode feedback circuitry (CMFC) having only one loop to control the output common mode voltage such that interaction between multiple loops caused by a CMFC is eliminated;

According to still another aspect of the invention, an amplifier with a class AB input stage in a differential configuration is implemented with common mode feedback circuitry (CMFC) having only one loop to control the output common mode voltage such that the CMFC is less complex and requires less die area than known two loop CMFC implementations associated with class AB differential amplifiers.

According to still another aspect of the invention, an amplifier with a class AB input stage in a differential configuration is implemented with common mode feedback circuitry (CMFC) having only one loop to control the output common mode voltage such that the resultant class AB differential amplifier power consumption is reduced when compared with conventional class AB differential amplifier architectures that employ two loops to control the common mode output voltage.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawings in which like reference numerals designate like parts throughout the figures thereof and wherein.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
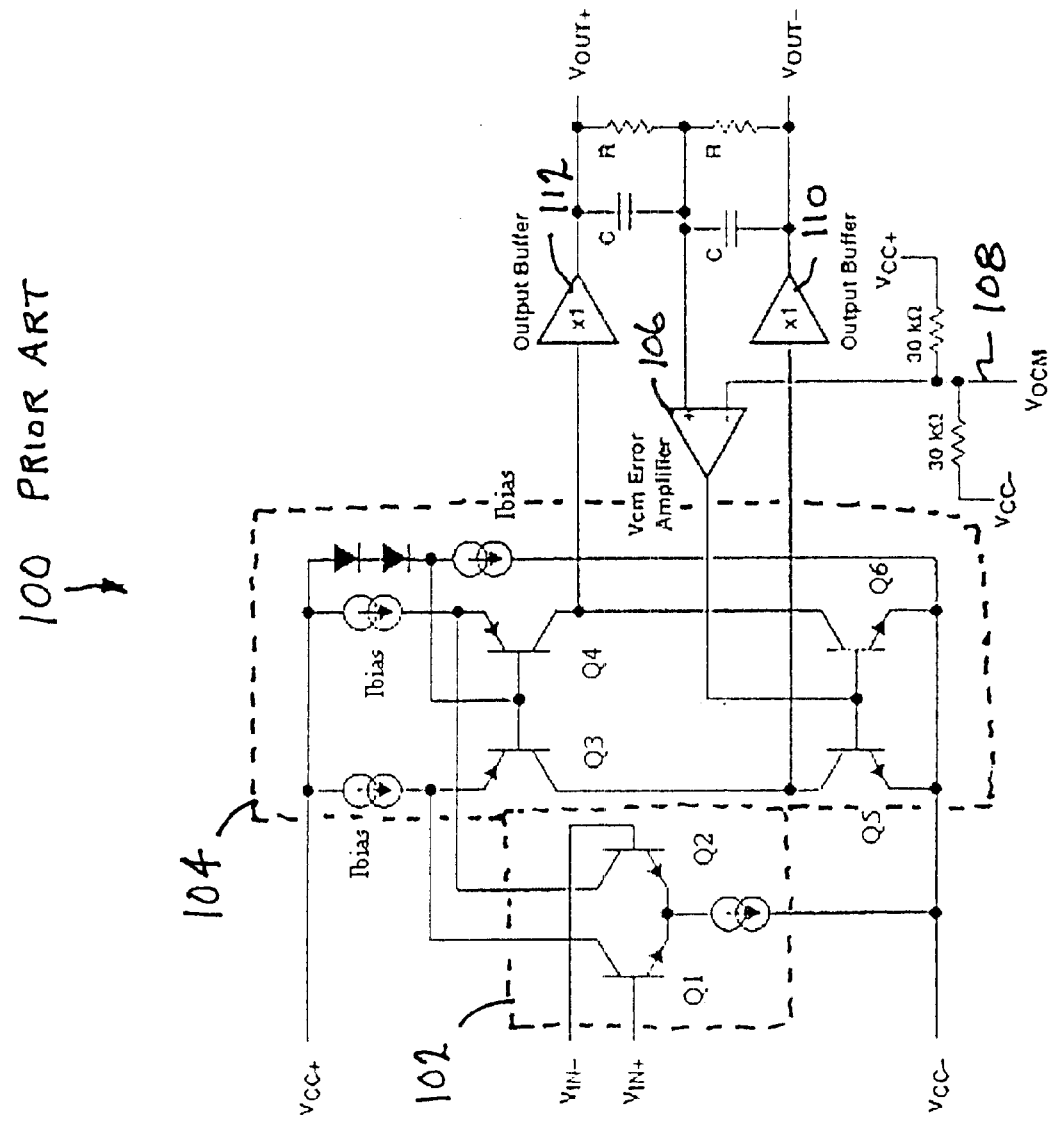
FIG. 1 is a schematic diagram that illustrates one implementation of an amplifier with a class A differential input stage that includes an emitter coupled pair input stage with a folded cascode gain stage.
Figure 2:
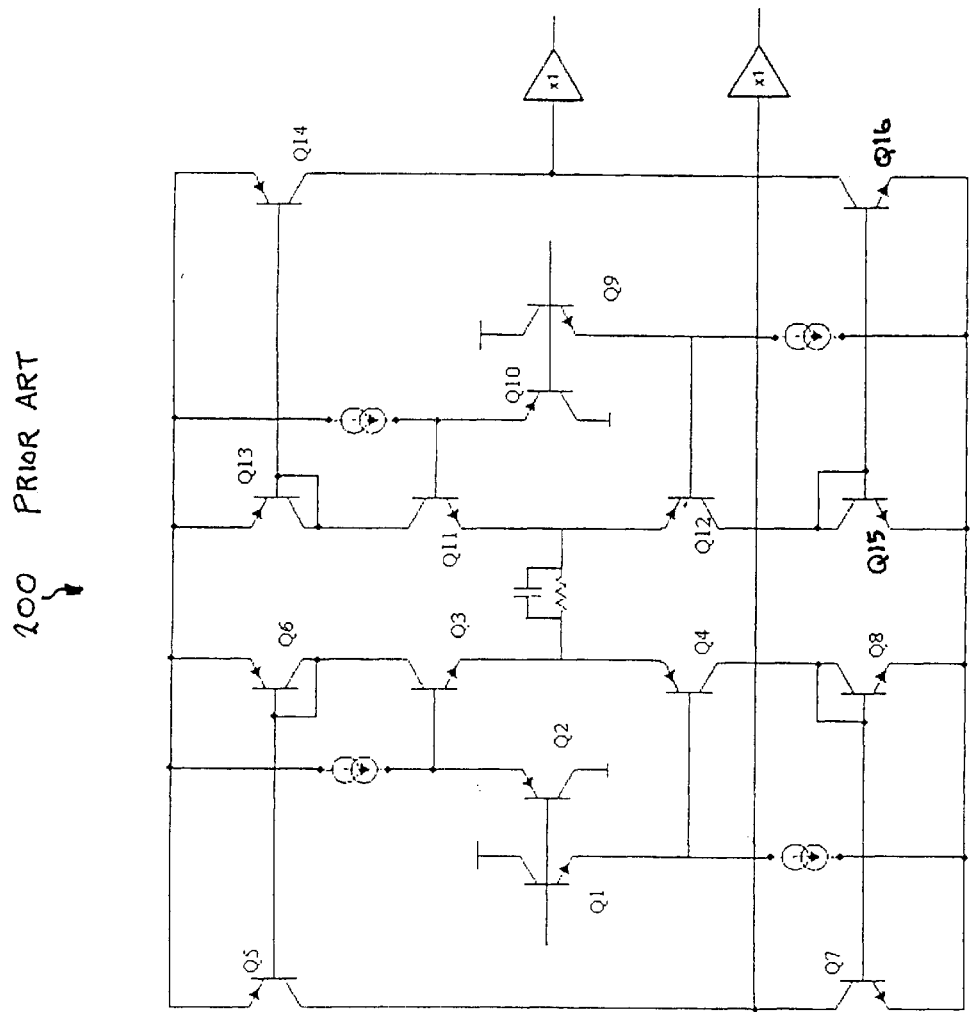
FIG. 2 is a schematic diagram that illustrates a conventional amplifier with a differential class AB input stage without common mode feedback circuitry.

The embodiments presented herein regarding the present invention are best understood by again discussing the prior art with reference to FIGS. 1 and 2 before setting forth a detailed description of the preferred embodiments. Differential amplifiers are very useful devices when dealing with differential systems. They have several advantages such as very good common mode rejection ratio since everything that is common will get canceled at the differential output. Some applications of differential amplifiers include single ended to differential conversion, differential ADC driver, differential transmitter and receiver, and output level shifter.

Differential amplifiers are not too different from single ended amplifiers. Several single ended topologies can be converted to differential topologies. The most obvious difference between differential amplifiers and their single ended counterparts is that they have two outputs instead of one. With the addition of this output, another difference arises, which is the "output common mode feedback circuit" (CMFC). Extra circuitry is necessary to direct the outputs where to go DC wise. Since this signal is common to both outputs differentially, it will cancel, leaving at the differential output only the amplified differential input signal.

Implementing such a common mode circuit is challenging. FIG. 1 illustrates one implementation of an amplifier 100 having a class A input stage that includes an emitter coupled pair input stage 102 with a folded cascode gain stage 104. The CMFC includes an error amplifier 106 that compares the common mode voltage at the outputs to the voltage set on the $V_{ocm}$ pin 108 (seen defaulted to mid rail in FIG. 1). The error amplifier 106 adjusts the common mode voltage by changing the voltage in the bases of transistors Q5 and Q6. The feedback path of the error amplifier 106 in FIG. 1 is from the output of the error amplifier 106 to the bases of transistors Q5 and Q6, to the outputs of the main amplifier through the buffers 110, 112, and back into the positive input of the error amplifier 106.

The class AB input stage in a differential configuration has several advantages over the class A single emitter coupled pair input stage illustrated in FIG. 1. Some of these advantages include better slew rate and better THD performance, especially at high frequencies. It would be desirable to have a way of implementing the foregoing CMFC on this topology. FIG. 2 is a schematic diagram illustrating an amplifier 200 having a differential class AB input stage without the CMFC. It can be seen this topology is quite different from the one shown in FIG. 1. One of the primary differences between this kind of circuit and the circuit in FIG. 2 is that in FIG. 1 it is only necessary to manipulate the current of transistors Q5 and Q6 to control the output common mode voltage. In the circuit of FIG. 2, it is necessary to manipulate the top mirrors Q5, Q6 and Q13, Q14 as well as the bottom mirrors Q7, Q8 and Q15, Q16. The conventional prior art solution includes the use of two loops to control the two sets of mirrors, and that way control the output common mode voltage. This conventional approach has been problematic however since it results in undesirable distortion associated with additional parasitics and mismatch between the loops, stability problems due to complexity of the multiple control loops and the interaction between them, added complexity, and circuitry that consumes additional die area. It is desirable to have a way of implementing the CMFC on a class AB input stage in a differential configuration in a manner that does not result in additional distortion, or stability problems due to increased complexity of multiple control loops, and that does not undesirably increase the required die area.

Figure 3:
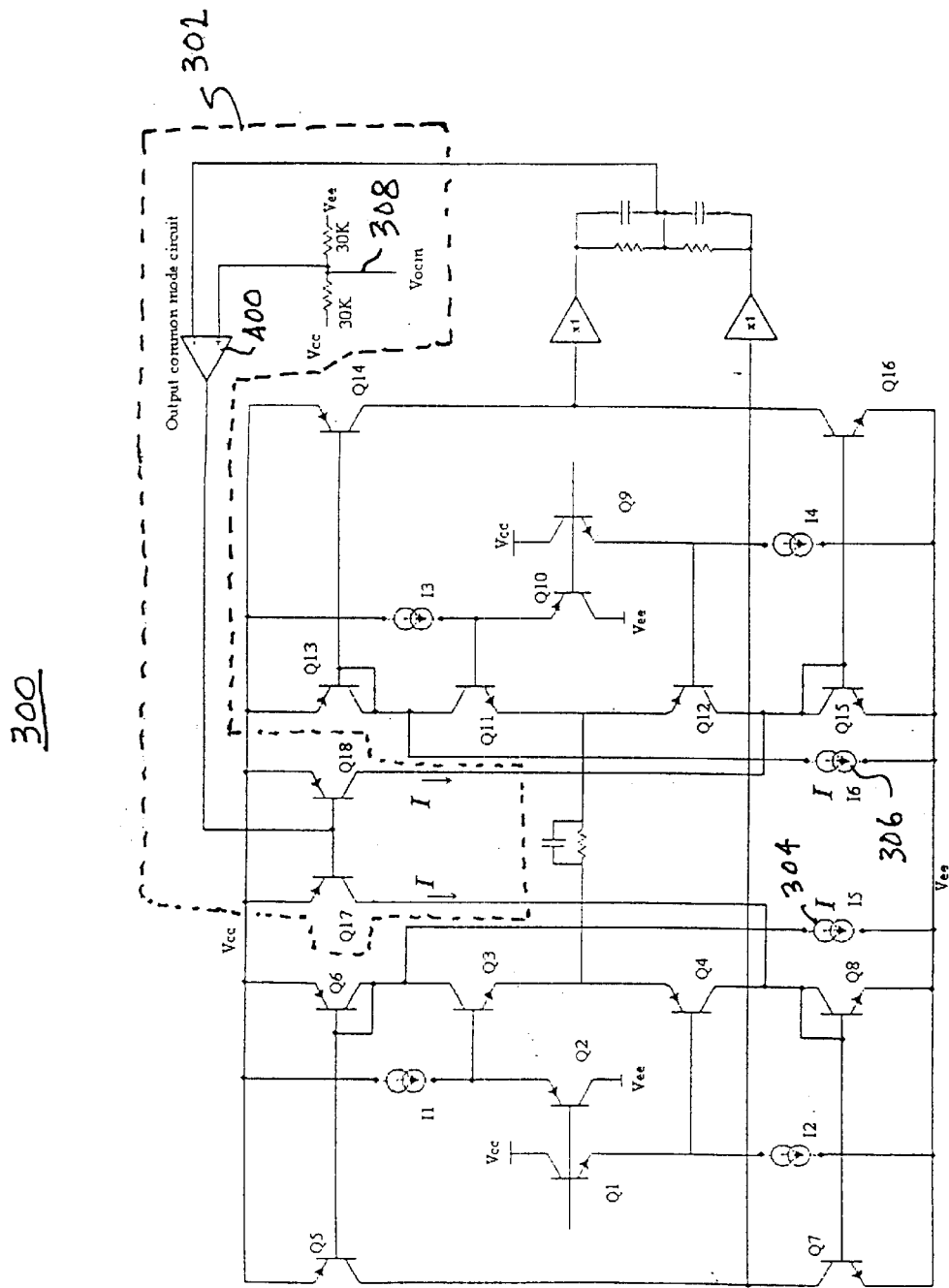
FIG. 3 is a schematic diagram illustrating the conventional amplifier shown in FIG. 2 modified with common mode feedback circuitry according to one embodiment of the present invention.

Looking now at FIG. 3, a schematic diagram illustrates an amplifier 300 having differential class AB input stage with common mode feedback circuitry (CMFC) 302 according to one embodiment of the present invention. The common mode output voltage in amplifier 300 is set by introducing an offset of current into the current mirrors formed by transistors Q5 to Q8 and Q13 to Q16 (4 mirrors in total). This technique creates a DC offset voltage in the outputs that will be equal to the common mode output voltage. It is necessary to be able to manipulate the top mirrors formed by transistors Q5, Q6, Q13, and Q14 as well as the bottom mirrors formed by transistors Q7, Q8, Q15 and Q16 as stated herein before. This task is implemented using a single loop by introducing standing currents 304, 306 at the top to the collector nodes of transistors Q3 and Q 11, and then connecting the CMFC 302 at the bottom to the collector nodes of transistors Q4 and Q12. The DC currents of the CMFC 302 and the standing currents 304, 306 are the same, so in steady state, everything is balanced. When there is a change in the output or in the $V_{ocm}$ pin 308, the currents in the CMFC 302 will change causing the currents that get fed to the bottom mirrors formed by transistors Q7, Q8, Q15 and Q16 to change. This current will increase or decrease creating a difference between the standing currents 304, 306 that get fed on the top and the DC currents of the CMFC that get fed on the bottom. This action creates an offset that will change the common mode output voltage until it settles to what is set at the $V_{ocm}$ pin 308.

Figure 4:
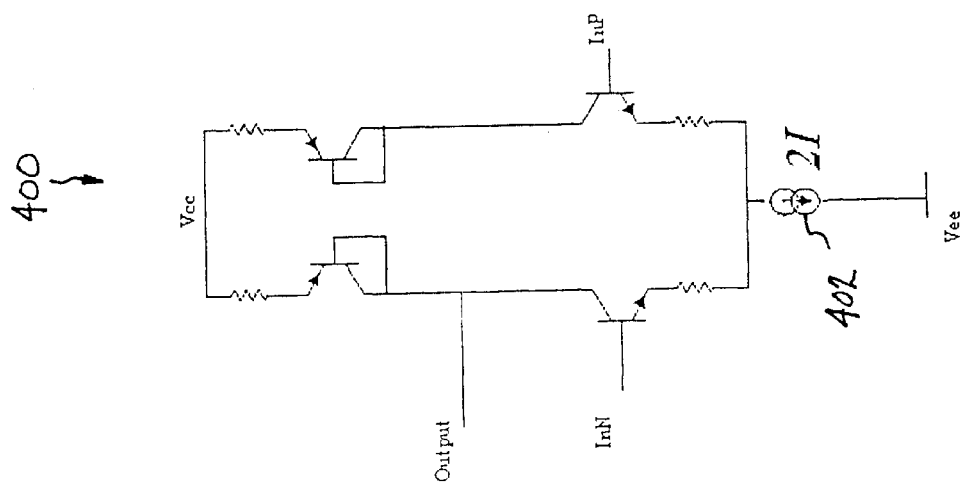
FIG. 4 is a schematic diagram illustrating one implementation of a common mode feedback circuitry amplifier according to one embodiment of the present invention.

FIG. 4 is a schematic diagram illustrating one implementation of the common mode feedback circuitry (CMFC) amplifier 400 seen in FIG. 3 according to one embodiment of the present invention. The tail current 402 is two times as large as the standing current (304 or 306) seen in FIG. 3. This means that when there is a change in to $V_{own}$ 308, the currents from transistors Q17 and Q18 can get as large as 2I. This feature allows a symmetrical bipolar common output range.

The present method then, represents a significant advancement in the art of high performance class AB differential amplifiers. This invention has been described in considerable detail in order to provide those skilled in the equalizer art with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A class AB input differential amplifier circuit comprising:
   a first upper current mirror and a first lower current mirror associated with a first output;
   a second upper current mirror and a second lower current mirror associated with a second output;
   a first current source configured to introduce a first standing current to the first upper current mirror;
   a second current source configured to introduce a second standing current to the second upper current mirror;
   a buffer circuit connected to the first and second output and having a common output; and
   a common mode feedback circuit having a common mode voltage input and configured to introduce an output current to the first lower current mirror and the second lower current mirror in response to a voltage change at the common output or at the common mode voltage input such that the output current will change the common mode output voltage associated with the differential class AB amplifier until it settles to a value set at the common mode voltage input.

2. The class AB input differential amplifier circuit according to claim 1 wherein the first standing current and the second standing current have substantially identical values.

3. The class AB input differential amplifier circuit according to claim 2 wherein the common mode feedback circuit is further configured to have a tail current value that is substantially twice the standing current value.

4. The class AB input differential amplifier circuit according to claim 1 wherein the common mode feedback circuit is further configured to generate an output current capable of allowing the differential class AB amplifier to achieve a symmetrical bipolar common output range.

* * * * *